(12) United States Patent
Seyama et al.

(10) Patent No.: US 11,410,866 B2
(45) Date of Patent: Aug. 9, 2022

(54) APPARATUS AND METHOD FOR LINEARLY MOVING MOVABLE BODY RELATIVE TO OBJECT

(71) Applicant: SHINKAWA LTD., Tokyo (JP)

(72) Inventors: Kohei Seyama, Tokyo (JP); Tetsuya Utano, Tokyo (JP); Yuichiro Noguchi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 344 days.

(21) Appl. No.: 16/650,372

(22) PCT Filed: Aug. 28, 2018

(86) PCT No.: PCT/JP2018/031744
§ 371 (c)(1),
(2) Date: May 11, 2020

(87) PCT Pub. No.: WO2019/044819
PCT Pub. Date: Mar. 7, 2019

(65) Prior Publication Data
US 2020/0411352 A1    Dec. 31, 2020

(30) Foreign Application Priority Data

Aug. 28, 2017   (JP) .............................. JP2017-162928

(51) Int. Cl.
*H01L 21/68*     (2006.01)
*H01L 23/00*     (2006.01)

(52) U.S. Cl.
CPC ............ *H01L 21/681* (2013.01); *H01L 24/78* (2013.01); *H01L 24/85* (2013.01); *H01L 2224/78753* (2013.01); *H01L 2224/85132* (2013.01)

(58) Field of Classification Search
None
See application file for complete search history.

(56) References Cited

U.S. PATENT DOCUMENTS 6,464,126 B2    10/2002    Hayata et al.
2015/0280529 A1*   10/2015    Maamari ................ H02K 11/22
                                                                     310/12.06
(Continued)

FOREIGN PATENT DOCUMENTS

JP      S62-173151      7/1987
JP      H09-64085      3/1997
(Continued)

OTHER PUBLICATIONS

"International Search Report (Form PCT/ISA/210) of PCT/JP2018/031744," dated Nov. 20, 2018, with English translation thereof, pp. 1-4.

*Primary Examiner* — J. E. Schoenholtz
(74) *Attorney, Agent, or Firm* — JCIPRNET

(57) ABSTRACT

The present invention is provided with: a base moving linearly relative to a substrate and having a first and second positions that are spaced apart from each other by a predetermined interval a in the movement direction; a linear scale where a plurality of graduations having a predetermined pitch are provided along the movement direction; encoder heads which respectively are disposed at the first and second positions of the base and detect first and second graduation numbers of the linear scale with respect to the first and second positions, wherein, as the base is moved along the linear scale, the first and second graduation numbers are detected in this order in the respective encoder heads, and the movement amount of the base is controlled on the basis of the ratio between the predetermined interval and the distance between the first graduation number and the second graduation number on the scale.

10 Claims, 7 Drawing Sheets

(56) References Cited

U.S. PATENT DOCUMENTS

| | | | |
|---|---|---|---|
| 2017/0148759 A1 | 5/2017 | Hayata et al. | |
| 2017/0309503 A1* | 10/2017 | Seyama | H05K 13/0406 |
| 2020/0279762 A1* | 9/2020 | Seyama | G05B 19/195 |

FOREIGN PATENT DOCUMENTS

| | | |
|---|---|---|
| JP | 2001-203234 | 7/2001 |
| JP | 2004-167641 | 6/2004 |
| JP | 2013-195778 | 9/2013 |
| JP | 2016-139750 | 8/2016 |
| WO | 2015170645 | 11/2015 |

* cited by examiner

APPARATUS AND METHOD FOR LINEARLY MOVING MOVABLE BODY RELATIVE TO OBJECT

CROSS-REFERENCE TO RELATED APPLICATION

This application is a 371 application of the international PCT application serial no. PCT/JP2018/031744, filed on Aug. 28, 2018, which claims the priority benefit of Japan application no. 2017-162928, filed on Aug. 28, 2017. The entirety of each of the above-mentioned patent application is hereby incorporated by reference herein and made a part of this specification.

BACKGROUND OF THE INVENTION

Technical Field

The present invention relates to an apparatus and a method for linearly moving a movable body with respect to an object.

Related Art

For example, in manufacture of a semiconductor apparatus, mounting apparatuses for mounting electronic components such as a semiconductor die and the like on a substrate or another semiconductor die, or many bonding apparatuses such as wire bonding apparatuses for bonding wires to electrodes of the semiconductor die and electrodes of the substrate are used. The bonding apparatus includes: a bonding head mounted on an XY table, a bonding arm attached to the bonding head to move a bonding tool in an up-down direction, and a position detection camera attached to the bonding head and detecting a bonding position of the substrate. A center line of the bonding tool and an optical axis of the position detection camera are arranged apart from each other at a predetermined offset distance. Besides, in many cases, after the optical axis of the position detection camera is aligned with the bonding position, bonding is performed by moving the bonding head by the offset distance and moving the center line of the bonding tool to the bonding position.

On the other hand, if the bonding operation is continued, the offset distance changes due to temperature rise. Thus, even if the bonding head is moved by the offset distance after the optical axis of the position detection camera is aligned with the bonding position, the center line of the bonding tool may not be the bonding position. Therefore, a bonding apparatus which calibrates an offset distance in the middle of the bonding operation has been proposed (for example, see patent literature 1).

LITERATURE OF RELATED ART

Patent Literature

Paten literature 1: Japanese Patent Laid-Open No. 2001-203234

SUMMARY

Problems to be Solved

In contrast, in many bonding apparatuses, a linear scale is used to detect a movement amount of a base having a bonding head. In this case, there is a problem that when the temperature of the bonding apparatus rises, the linear scale expands and an error occurs in the movement amount of the base that moves on the basis of graduations of the linear scale. In addition, because the temperature rise of the linear scale is not uniform, the thermal expansion amount of the linear scale often differs depending on sites. Thus, there is a problem that mounting precision of electronic components is reduced due to reduction in position detection precision of the bonding head.

Therefore, the objective of the present invention is to improve the movement precision of a movable body.

Means to Solve Problems

An apparatus of the present invention linearly moves a movable body with respect to an object and includes: the movable body which is moved linearly with respect to the object and has a first position and a second position apart from each other by a predetermined interval in a movement direction; a scale which is arranged along the movement direction of the movable body and in which a plurality of graduations is arranged with predetermined pitches along the movement direction; a first detection unit which is arranged in the first position of the movable body and detects a first graduation number of the scale with respect to the first position; a second detection unit which is arranged in the second position of the movable body and detects a second graduation number of the scale with respect to the second position; and a control unit which sequentially detects the first graduation number and the second graduation number by the first detection unit and the second detection unit while moving the movable body along the scale, and controls a movement amount of the movable body on the basis of a ratio of the predetermined interval with respect to a distance between the first graduation number and the second graduation number on the scale.

In the apparatus of the present invention, the movable body is a transport mechanism which transports a semiconductor die to the object, the object is a substrate on which the semiconductor die that has been transported is mounted or other semiconductor die, and the apparatus is an apparatus for mounting the semiconductor die on the object.

In the apparatus of the present invention, the control unit can calculate, on the basis of the ratio of the predetermined interval with respect to the distance between the first graduation number and the second graduation number on the scale, a position compensation coefficient for each predetermined number of graduations from one end of the scale.

The apparatus of the present invention can include a distance detector for detecting a distance of the movable body from a reference position. The control unit can move the movable body by a reference distance while detecting the distance of the movable body from the reference position by the distance detector, and detect a graduation number difference of the scale before and after moving the movable body by the reference distance by the first detection unit or the second detection unit, and correct the movement amount on the basis of the reference distance and the graduation number difference.

The apparatus of the present invention can include: a reference member in which position marks are arranged apart from each other by a reference distance; and an image acquisition part which is arranged in the movable body and acquires images of the position marks. The control unit can move the movable body by the reference distance on the basis of the images of the position marks acquired by the image acquisition part, detects the graduation number difference of the scale at a time of moving by the first detection unit or the second detection unit, and correct the movement amount on the basis of the reference distance and the graduation number difference.

A method of the present invention is a method for linearly moving a movable body with respect to an object and includes: linearly moving the movable body having a first position and a second position apart from each other by a predetermined interval in a movement direction with respect to the object; arranging a scale along the movement direction of the movable body, a plurality of graduations being arranged with predetermined pitches along the movement direction in the scale; arranging a first detection unit for detecting a first graduation number of the scale with respect to the first position in the first position of the movable body; arranging a second detection unit for detecting a second graduation number of the scale with respect to the second position in the second position of the movable body; and sequentially detecting the first graduation number and the second graduation number by the first detection unit and the second detection unit while moving the movable body along the scale, and controlling a movement amount of the movable body on the basis of a ratio of the predetermined interval with respect to a distance between the first graduation number and the second graduation number on the scale.

The method of the present invention can include: detecting a distance of the movable body from a reference position by a distance detector; moving the movable body by a reference distance while detecting the distance of the movable body from the reference position by the distance detector, and detecting a graduation number difference of the scale before and after moving the movable body by the reference distance by the first detection unit or the second detection unit; and correcting the movement amount on the basis of the reference distance and the graduation number difference.

The method of the present invention can include: arranging position marks apart from each other by a reference distance in a reference member; arranging an image acquisition part in the movable body; acquiring images of the position marks by the image acquisition part, and moving the movable body by the reference distance on the basis of the acquired images of the position marks; detecting the graduation number difference of the scale when the movable body is moved by the reference distance by the first detection unit or the second detection unit; and correcting the movement amount on the basis of the reference distance and the graduation number difference.

Effect

The present invention can improve the movement precision of a movable body.

DESCRIPTION OF THE EMBODIMENTS

<Configuration of Mounting Apparatus>

Figure 1:
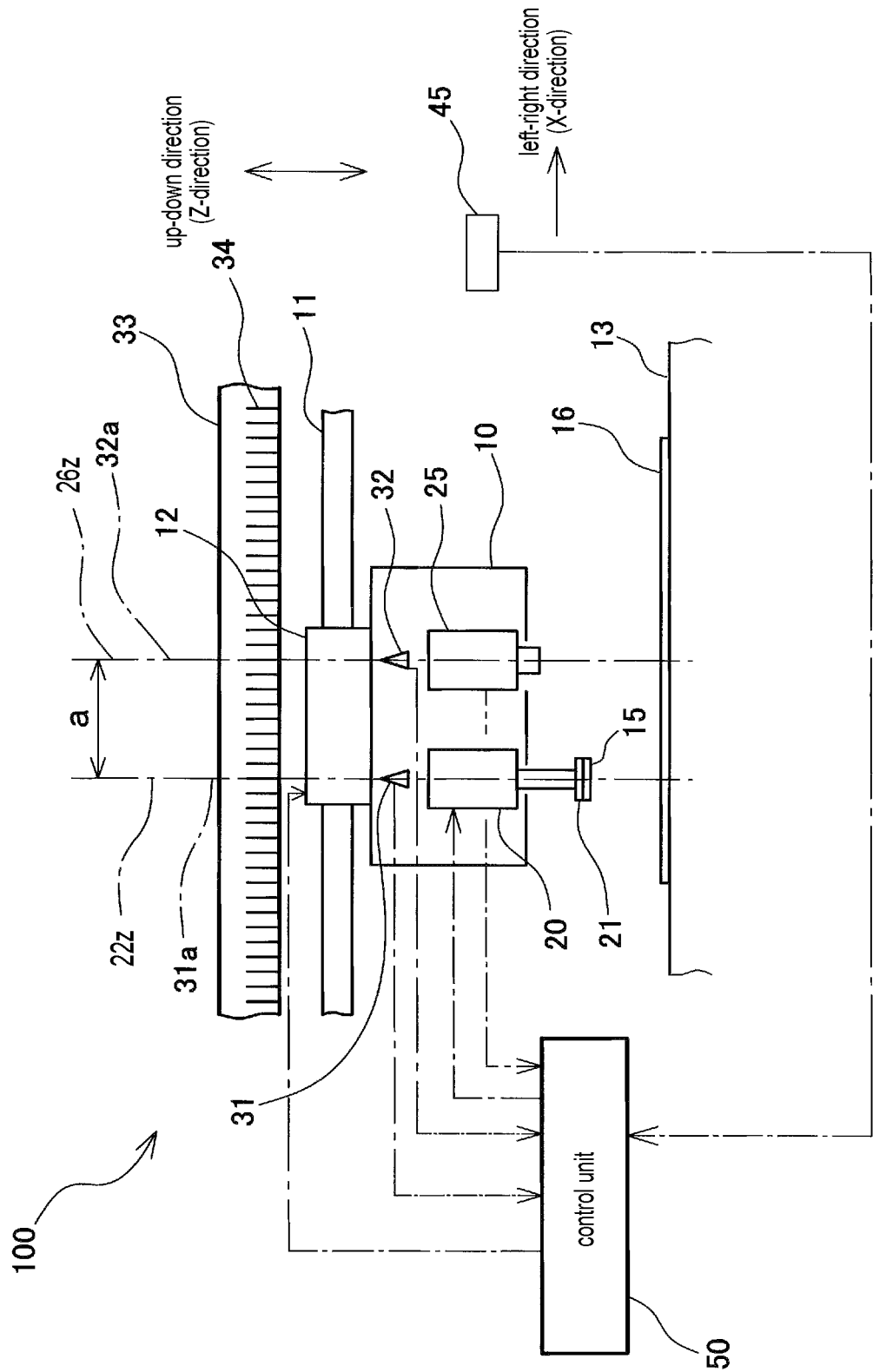
FIG. 1 is a system diagram showing a system configuration of a mounting apparatus in an embodiment.

A mounting apparatus 100 that mounts a semiconductor die 15 on a substrate 16 or the like is described below as an example of an apparatus that linearly moves a movable body with respect to an object. As shown in FIG. 1, the mounting apparatus 100 of the embodiment mounts the semiconductor die 15 which is a first electronic component on the substrate 16 which is an object or another semiconductor die which is a second electronic component not shown. The mounting apparatus 100 includes a base 10 which is a movable body, a bonding head 20, a camera 25, a bonding head-side encoder head 31 which is a first detection unit, a camera-side encoder head 32 which is a second detection unit, a linear scale 33, a control unit 50, a laser distance detector 45, and a bonding stage 13 for attracting and fixing the substrate 16 which is the object. The mounting apparatus 100 is, for example, a flip-chip bonding apparatus that mounts the semiconductor die 15 on the substrate 16 after inverting the semiconductor die 15 However, the mounting apparatus 100 can also be a die bonding apparatus that mounts the semiconductor die 15 on the substrate 16 without inverting the semiconductor die 15.

The base 10 is guided by a guide rail 11 extending in an X-direction which is a linear direction to linearly move in the X-direction. In addition, a linear motor 12 for driving the base 10 in the X-direction is attached to the base 10.

The bonding head 20 and the camera 25 which is an image acquisition part are attached to the base 10. The bonding head 20 is configured for moving a bonding tool 21 in a Z-direction which is a vertical direction, the bonding tool 21 being a mounting tool for vacuum-attracting the semiconductor die 15 to bond the semiconductor die 15 to the substrate 16. The reference sign 22z in FIG. 1 indicates a center line of the bonding head 20 in the Z-direction. In addition, because the bonding tool 21 is disposed coaxially with the center line 22z of the bonding head 20 in the Z-direction, the center line 22z is a line passing through the center of the bonding tool 21. The camera 25 acquires an image of the substrate 16 by capturing the image from above. The reference sign 26z in FIG. 1 indicates an optical axis of the camera 25. The bonding head 20 and the camera 25 are attached to the base 10 in a manner that the center line 22z of the bonding head 20 in the Z-direction and the optical axis 26z of the camera 25 are separated from each other by a predetermined interval a in the X-direction which is the movement direction of the base 10. Here, the predetermined interval a is an offset distance. The base 10 is a transport mechanism for transporting the semiconductor die 15 attracted by the bonding tool 21 to the substrate 16.

In addition, the bonding head-side encoder head 31 and the camera-side encoder head 32 are attached to the base 10. As shown in FIG. 1, the bonding head-side encoder head 31 is attached to a first position of the base 10 in a manner that a center line 31a is at the same position as the center line 22z of the bonding head 20 in the Z-direction. In addition, the camera-side encoder head 32 is attached to a second position of the base 10 in a manner that a center line 32a is at the same position as a position C of the optical axis 26z of the camera 25. Therefore, the first position where the bonding head-side encoder head 31 is attached and the second position where the camera-side encoder head 32 is attached are separated by the predetermined interval a in the X-direction which is the movement direction of the base 10.

At a position facing the bonding head-side encoder head 31 and the camera-side encoder head 32, the common linear scale 33 extending in the X-direction which is the movement direction of the base 10 is arranged. The linear scale 33 has a plurality of graduations 34 engraved at predetermined pitches p. The bonding head-side encoder head 31 and the camera-side encoder head 32 optically read the graduations 34 and detect a graduation number on the linear scale 33.

The bonding stage 13 vacuum-attracts the substrate 16.

The laser distance detector 45 is arranged at a position separate from the bonding stage 13 and detects a distance of the base 10 from the reference position by a laser. The laser distance detector 45 can detect the distance of the base from the reference position in the X-direction regardless of a change in a length of the linear scale 33 caused by a temperature change of the mounting apparatus 100.

As shown in FIG. 1, the linear motor 12 and the bonding head 20 are connected to the control unit 50 and operated according to commands from the control unit 50. In addition, the bonding head-side encoder head 31 and the camera-side encoder head 32 are connected to the control unit 50, and data of the detected graduation position of the linear scale 33 is input to the control unit 50. In addition, the camera 25 and the laser distance detector 45 are also connected to the control unit 50, and the image captured by the camera 25 and data of the movement distance of the base 10 in the X-direction detected by the laser distance detector 45 are input to the control unit 50.

The control unit 50 is a computer including a CPU that internally performs information processing and a memory that stores operation programs and data, and adjusts the position or the movement amount of the base 10 in the X-direction.

The guide rail 11 and the linear scale 33 of the mounting apparatus 100 shown in FIG. 1 can be integrally moved in a Y-direction by a Y-direction driving mechanism which is not shown. The Y-direction driving mechanism is connected to the control unit 50 and is operated according to a command from the control unit 50. Moreover, the Y-direction is a horizontal direction orthogonal to the X-direction.

Moreover, in the mounting apparatus 100 of the embodiment, it is described that the bonding head-side encoder head 31 is attached to the base 10 in a manner that the center line 31a is disposed at the same position as the center line 22z of the bonding head 20 in the Z-direction, and the camera-side encoder head 32 is attached to the base 10 in a manner that the center line 32a is disposed at the same position as the optical axis 26z of the camera 25, but the present invention is not limited hereto. If the bonding head-side encoder head 31 and the camera-side encoder head 32 are arranged separate from each other by the predetermined interval a in the X-direction, the bonding head-side encoder head 31 can be arranged near the bonding head 20, and the camera-side encoder head 32 can be arranged near the camera 25.

<Basic Operation of Mounting Apparatus>

Figure 2:
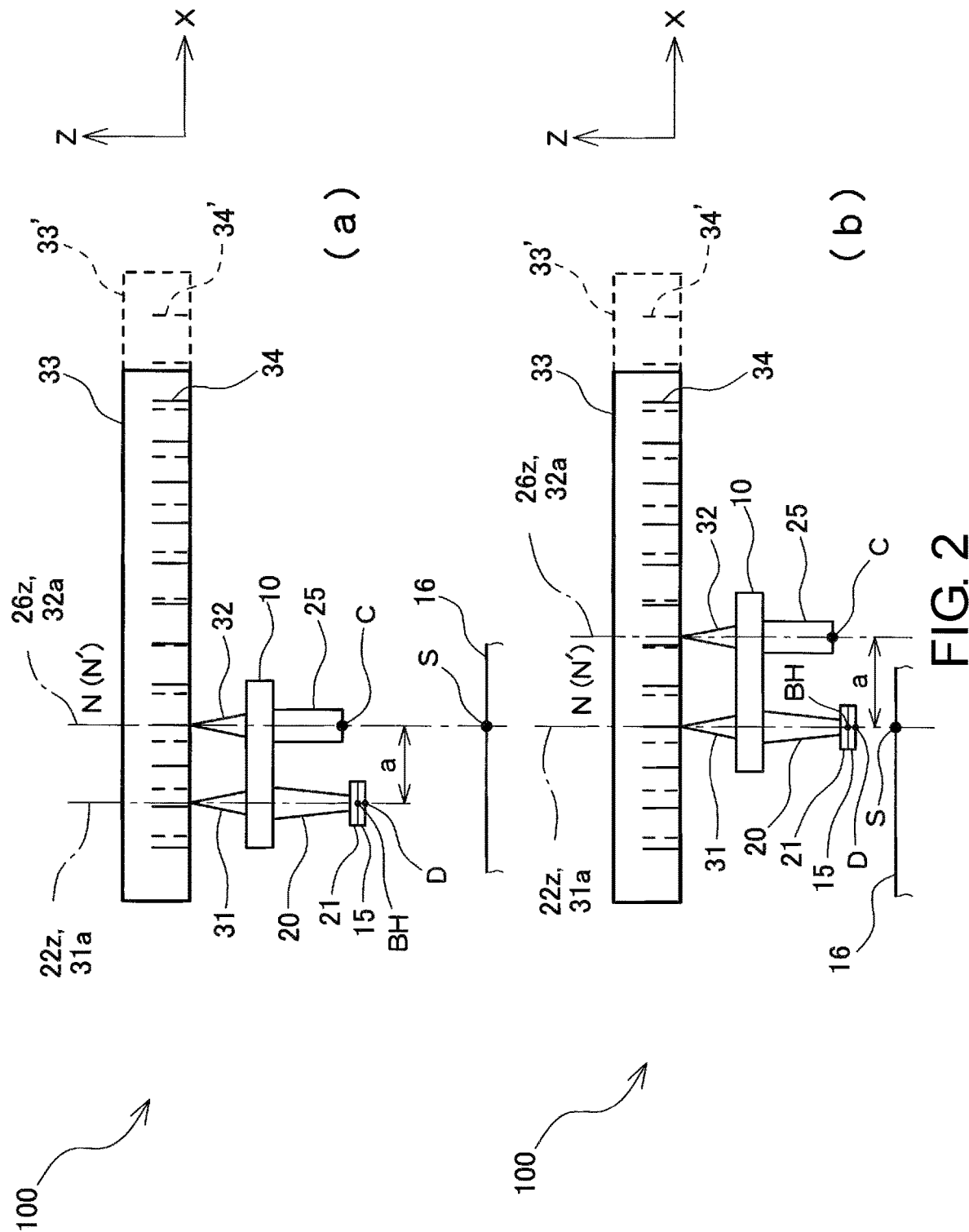
FIG. 2 is an illustration diagram showing a basic operation when a linear scale thermally expands in the mounting apparatus shown in FIG. 1, wherein (a) shows a state at a reference position, and (b) shows a state in which a base is moved in a manner that a center line of a bonding head-side encoder head is aligned with a graduation position of the linear scale detected by a camera-side encoder head.

Next, a basic operation of the mounting apparatus 100 of the embodiment is described with reference to FIGS. 2 and 3. (a) of FIG. 2 shows a case where the base 10 is at the image capturing position. In description of FIGS. 2 and 3, the image capturing position is a position where the position C of the optical axis 26z of the camera 25 coincides with a center position S of a bonding region, a center position BH of the bonding tool 21 and a center position D of the semiconductor die 15 coincides with each other, and the center position D of the semiconductor die 15 attracted by the bonding tool 21 is on the center line 22z of the bonding head 20 in the Z-direction.

As shown in (a) of FIG. 2, at the image capturing position, the position C (x, y) of the optical axis 26z of the camera 25 coincides with the center position S (x, y) of the bonding region. At the image capturing position, the center line 32a of the camera-side encoder head 32 is at the position of the N-th graduation of the linear scale 33. Data indicating that the center line 32a of the camera-side encoder head 32 is at the position of the N-th graduation of the linear scale 33 is input from the camera-side encoder head 32 to the control section 50. Next, the control unit 50 moves the base 10 in the X-direction by the linear motor 12 shown in FIG. 1. At this time, the control unit 50 detects the data of the graduation of the linear scale 33 by the bonding head-side encoder head 31. Then, the control unit 50 moves the base 10 in the X-direction until the graduation of the linear scale 33 detected by the bonding head-side encoder head 31 reaches the position of the N-th graduation. As shown in (b) of FIG. 2, when the graduation of the linear scale 33 detected by the bonding head-side encoder head 31 reaches the position of the N-th graduation, the center line 22z of the bonding head 20 and the center position D of the semiconductor die 15 is at the position of the N-th graduation of the linear scale 33, that is, the center position S of the bonding region. In this way, the mounting apparatus 100 of the embodiment can make the center position D of the semiconductor die 15 coincide with the center position S of the bonding region.

In (a) of FIG. 2 and (b) of FIG. 2, a linear scale 33' and a graduation 34' indicated by broken lines show a state in which the linear scale 33 thermally expands. When the linear scale 33 thermally expands, the graduation position detected by the camera-side encoder head 32 at the image capturing position is N'. Then, the control unit 50 moves the base 10 in the X-direction until the graduation of the linear scale 33 detected by the bonding head-side encoder head 31 reaches the position of the N'-th graduation. Accordingly, the center position D of the semiconductor die 15 can be aligned to the position of the N'-th graduation of the linear scale 33, that is, the center position S of the bonding region.

As described above, even if the linear scale 33 thermally expands, the mounting apparatus 100 of the embodiment can align the center position D of the semiconductor die 15 to the center position S of the bonding region without performing calibration of the predetermined interval a that is an offset distance.

Figure 3:
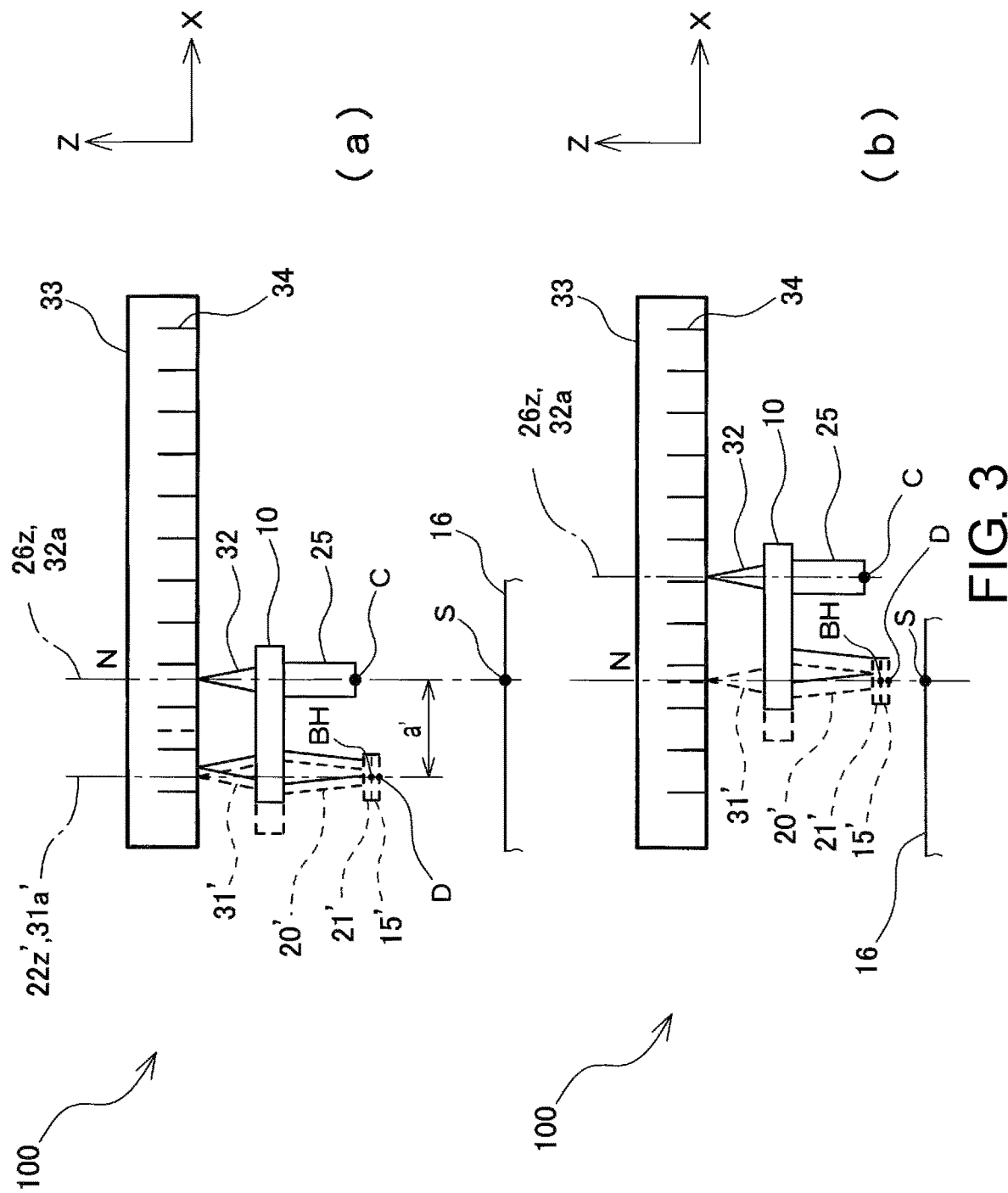
FIG. 3 is an illustration diagram showing a basic operation when the base thermally expands in the mounting apparatus shown in FIG. 1, wherein (a) shows a state at a reference position, and (b) shows a state in which the base is moved in a manner that the center line of the bonding head-side encoder head is aligned with the graduation position of the linear scale detected by the camera-side encoder head.

(a) of FIG. 3 and (b) of FIG. 3 show a case where the base 10 thermally expands in the X-direction. As shown in (a) of FIG. 3, at the image capturing position, the position C (x, y)

of the optical axis 26z of the camera 25 coincides with the center position S (x, y) of the bonding region. At the image capturing position, the center line 32a of the camera-side encoder head 32 is at the position of the N-th graduation of the linear scale 33. At this time, the center line 22z' of the bonding head 20' is at a position separate from the optical axis 26z of the camera 25 in the X-direction by an interval a'.

Similarly as described with reference to (b) of FIG. 2, the control unit 50 moves the base 10 in the X-direction until the graduation of the linear scale 33 detected by the bonding head-side encoder head 31 reaches the position of the N-th graduation. Then, the center position D of the semiconductor die 15 is at the position of the N-th graduation of the linear scale 33, that is, the center position S of the bonding region. In this way, even if the base 10 thermally expands, the mounting apparatus 100 of the embodiment can align the center position D of the semiconductor die 15 to the center position S of the bonding region without performing calibration of the predetermined interval a that is an offset distance. In addition, the movement precision of the base 10 can be improved without adjusting the predetermined interval a.

<Calculation Operation (Calculation Method) of Position Compensation Coefficient k(n) of Linear Scale in Mounting Apparatus>

Next, a calculate operation of a position compensation coefficient k(n) of the linear scale 33 is described with reference to FIGS. 4 and 5. As described above with reference to FIGS. 2 and 3, even if the linear scale 33 or the base 10 thermally expands, the mounting apparatus 100 of the embodiment can align the center position D of the semiconductor die 15 to the center position S of the bonding region without performing calibration of the predetermined interval a that is an offset distance. However, if the linear scale 33 or the base 10 thermally expands, an error may occur when the base is moved from the reference position of the mounting apparatus 100 to a predetermined position. Therefore, the calculation operation (the calculation method) of the position compensation coefficient of the linear scale 33 is described below.

Figure 4:
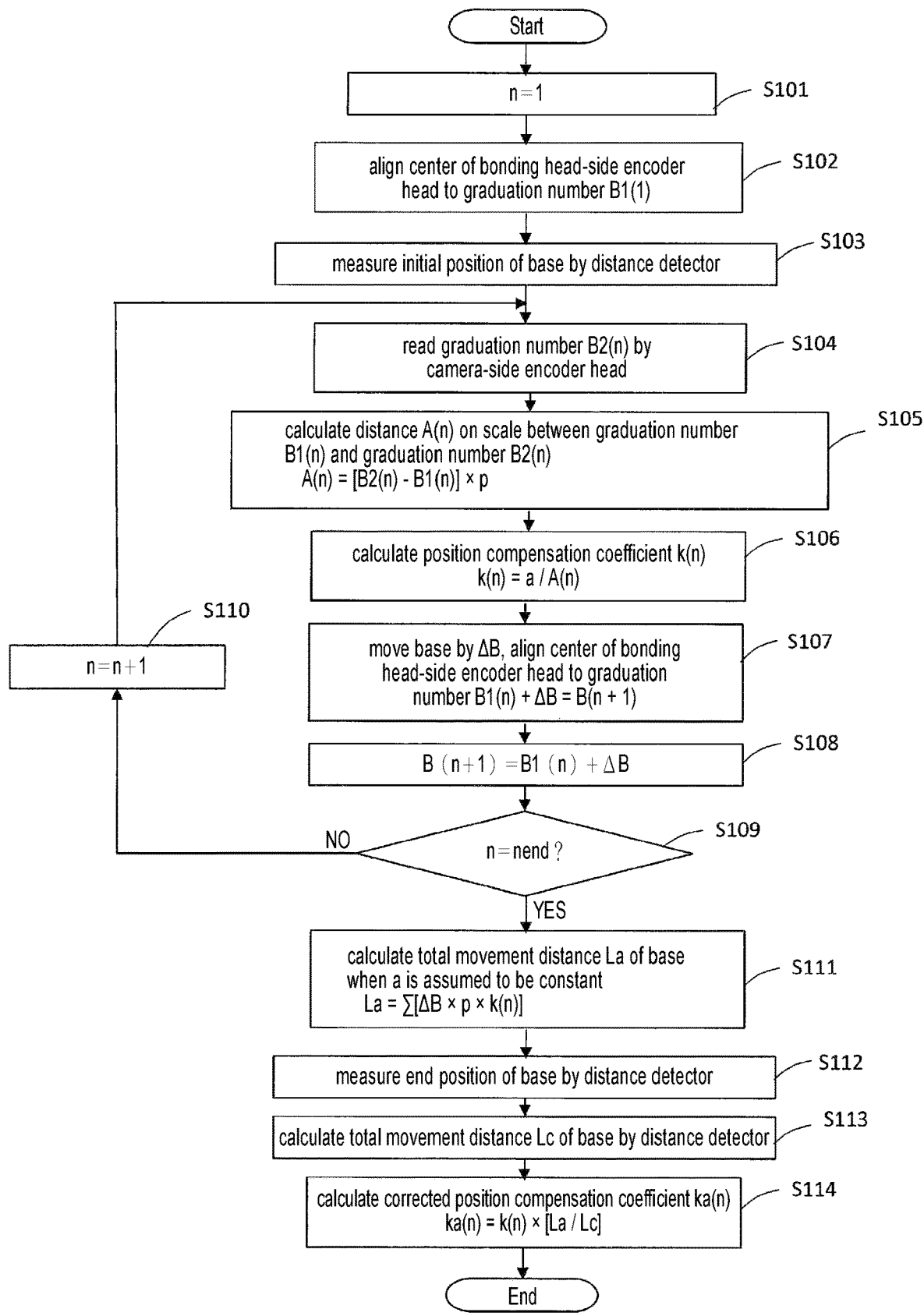
FIG. 4 is a flow chart showing a calculation operation of a position compensation coefficient of the linear scale in the mounting apparatus shown in FIG. 1.

As shown in step S101 of FIG. 4, the control unit 50 initially sets n to 1. Then, as shown in step S102 of FIG. 4 and in FIG. 5, the control unit 50 aligns the center line 31a of the bonding head-side encoder head 31 to a first graduation number B1(1) of the linear scale 33. Then, in step S103 of FIG. 4, the control unit 50 detects, by the laser distance detector 45, the position of the base 10 in the X-direction at this time as an initial position.

Next, as shown in step S104 of FIG. 4, the control unit 50 reads, by the camera-side encoder head 32, a second graduation number B2(1) of the linear encoder 33 on which the center line 32a of the camera-side encoder head 32 is positioned. Then, the control unit 50 proceeds to step S105 in FIG. 4 and calculates a distance A1(1) between the second graduation number B2(1) and the first graduation number B1(1) on the linear scale 33 by the following (Equation 1). The distance A(1) is also the distance detected by the linear scale 33 between the center line 31a of the bonding head-side encoder head 31 and the center line 32a of the camera-side encoder head 32.

$$A(1) = [B2(1) - B1(1) \times p] \quad \text{(Equation 1)}$$

In (Equation 1), p is the pitch of the graduations 34 of the linear scale 33.

Next, the control unit 50 proceeds to step S106 in FIG. 4 and calculates the position compensation coefficient k(1) of the linear scale 33 by the following (Equation 2). The position compensation coefficient k(1) is a ratio of the predetermined interval a between the center line 31a of the bonding head-side encoder head 31 and the center line 32a of the force-measurement-side encoder head 32 with respect to the distance A(1) between the second graduation number B2(1) and the first graduation number B1(1) on the linear scale 33.

$$k(1) = a/A(1) \quad \text{(Equation 2)}$$

Steps S105 and S106 in FIG. 4 configure a correction coefficient calculation step.

Next, the control unit 50 proceeds to step S107 in FIG. 4, moves the base 10 by the linear motor 12 in the X-direction by a predetermined number of graduations ΔB, and aligns the center line 31a of the bonding head-side encoder head 31 to the second graduation number B2(1)=B1(1)+ΔB. Then, the control unit 50 proceeds to step S108 in FIG. 4 and stores B1(1)+AB to B1(2). The control unit 50 determines whether or not n reaches nend in step S109 in FIG. 4, and if n has not reached nend, the control unit 50 proceeds to step S110 in FIG. 4, increments n by 1 and returns to step S104 in FIG. 4 as n=n+1=2. Here, nend is a movement number required until the base 10 is moved to an end position, and a first graduation number B1(nend) indicates the graduation number of the linear scale 33 where the center line 31a of the bonding head-side encoder head 31 is positioned when the base 10 is moved to the end position. Step S104 and steps S107 to S110 of FIG. 4 configure a graduation number detection step.

As described above, the control unit 50 moves the base 10 linearly in the X-direction by the predetermined number of graduations ΔB of the linear scale 33, and sequentially detects, by the bonding head-side encoder head 31 and the camera-side encoder head 32, the first graduation number B1(n) of the linear scale 33 where the center line 31a of the bonding head-side encoder head 31 is positioned and the second graduation number B2(n) of the linear scale 33 where the center line 32a of the camera-side encoder head 32 is positioned. Then, the control unit 50 repeats the operation of calculating the position compensation coefficient k(n) of the linear scale 33, which is the ratio of the predetermined interval a between the center line 31a of the bonding head-side encoder head 31 and the center line 32a of the camera-side encoder head 32 with respect to the distance A(n) between the second graduation number B2(n) and the first graduation number B1(n) on the linear scale 33. In this way, the control unit 50 can calculate the position compensation coefficient k(n) for each predetermined number of graduations ΔB from one end of the linear scale 33, and calculate the position compensation coefficient k(n) of the linear scale 33 in each graduation number B(n) of the linear scale 33 as shown in the graph of FIG. 5.

Figure 5:
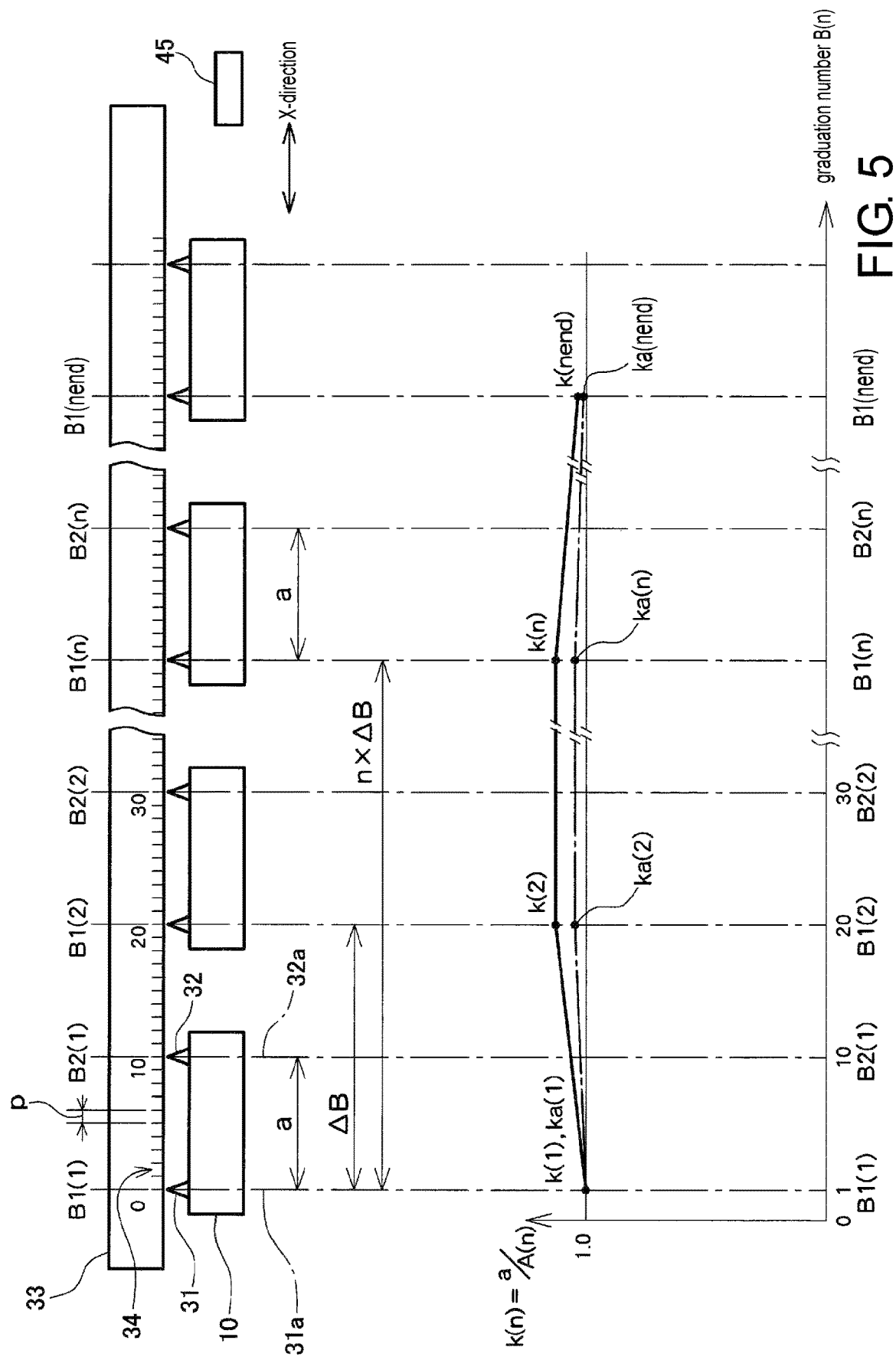
FIG. 5 is a graph showing a change in a position of the base with respect to the linear scale and a change in the position compensation coefficient with respect to the linear scale during the operation shown in FIG. 4.

Now, when neither the linear scale 33 nor the base 10 has thermal expansion at room temperature, as shown in FIG. 5, if the first graduation number B1(1) is set to 0 and the second graduation number B2(1) is set to 10 when n=1, $$A(1) = [B2(1) - B1(1)] \times p = [10 - 0] \times p = 10 \text{ graduations} \times p = a,$$

and $$k(1) = a/A(1) = 1.0.$$

At a position of n=2, the linear scale 33 thermally expands and the predetermined interval a of the base 10 is invariable.

In this case, the pitch p of the graduations 34 of the linear scale 33 is p' (>p) due to the thermal expansion. When the center line 31a of the bonding head-side encoder head 31 at n=2 is aligned to the first graduation number B1(2)=20th, the number of graduations between the second graduation number B2(2) and the first graduation number B1(2) is less than 10 graduations in the case without thermal expansion, for example, 9 graduations. Thus, the distance A(2) between the second graduation number B2(2) and the first graduation number B1(2) on the linear scale 33, or the distance A(2) between the center line 31a of the bonding head-side encoder head 31 and the center line 32a of the camera-side encoder head 32 is $$A(2) = [B2(2) - B1(2)] \times p = 9 \text{ graduations} \times p.$$

On the other hand, the predetermined interval a of the base 10 is invariable and is 10 graduations×p, and thus, $$k(2)=a/A(2)=(10 \text{ graduations} \times p)/(9 \text{ graduations} \times p) > 1.0.$$

As described above, when the linear scale 33 is extended by thermal expansion, the position compensation coefficient k(n) becomes a number larger than 1.0. In addition, conversely, when the linear scale 33 contracts at a temperature lower than the normal temperature, the position compensation coefficient k(n) becomes a number smaller than 1.0.

If the base 10 is moved by the predetermined number of graduations ΔB in the X-direction when the linear scale 33 does not thermally expand, the base 10 is moved by ΔB×p in the X-direction. If the linear scale 33 thermally expands or contracts, the movement distance of the base 10 compensates for the thermal expansion or contraction and becomes ΔB×p×k(n). Because k(n) is larger than 1.0 when the linear scale 33 thermally expands, the movement distance of the base 10 is larger than ΔB×p, and because k(n) is smaller than 1.0 when the linear scale 33 contracts, the movement distance of the base 10 is smaller than ΔB×p. In addition, the movement distance from the initial position to the end position of the base 10 is obtained by integrating ΔB×p×k(n) from n=1 to nend.

When n reaches nend, the control unit 50 proceeds to step S111 in FIG. 4 and calculates a total movement distance La of the base 10 by the following (Equation 3).

$$La=\Sigma[\Delta B \times p \times k(n)]. \quad \text{(Equation 3)}$$

The La calculated by the above (Equation 3) is the total movement distance of the base 10 when the predetermined interval a of the base 10 is invariable and the thermal expansion of the linear scale 33 is taken into consideration. However, the predetermined interval a of the base 10 also thermally expands depending on the temperature. Therefore, as described below, the position compensation coefficient k(n) is corrected in consideration of the thermal expansion amount of the predetermined interval a of the base 10.

The control unit 50 proceeds to step S112 in FIG. 4, detects the end position of the base 10 by the laser distance detector 45, proceeds to step S113 in FIG. 4, and calculates a movement distance Lc of the base 10 from the initial position to the end position detected by the laser distance detector 45.

The control unit 50 proceeds to step S114 in FIG. 4 and corrects the position compensation coefficient k(n) according to the following (Equation 4) to obtain ka(n).

$$ka(n)=k(n) \times [La/Lc] \quad \text{(Equation 4)}$$

The control unit 50 stores the corrected position compensation coefficient ka(n) in the memory. As shown in FIG. 5, the corrected position compensation coefficient ka(n) shows a distribution of the position compensation coefficient ka(n) of the linear scale 33 corresponding to the graduation number B(n) of the linear scale 33 in consideration of the change in the predetermined interval a of the base 10 caused by the thermal expansion or a map of the position compensation coefficient ka(n). Steps S111 to S114 in FIG. 4 configure a correction coefficient correction step.

The control unit 50 uses the corrected position compensation coefficient ka(n) to correct, as follows, the position of the center line 31a of the bonding head-side encoder head 31 detected using the linear scale 33. When the graduation number of the linear scale 33 detected by the bonding head-side encoder head 31 is B100 and B100=ΔB×m+j, the control unit 50 calculates a distance L100 from a graduation number 0 to the center line 31a of the bonding head-side encoder head 31 as $$L100=[\Sigma \Delta B \times ka(n) \times p]_{(n=1 \text{ to } m)}+ka(m+1) \times j \times p$$

and controls the movement amount or movement distance of the base 10.

In other words, when no correction is made, the control unit 50 corrects, using the corrected position compensation coefficient ka(n), a movement distance L100b=(ΔB×m+j)×p of the bonding head-side encoder head 31 from the graduation number 0 to the graduation number B100 detected by the linear scale 33 to the distance L100=[ΣΔB×ka(n)×p]$_{(n=1 \text{ to } m)}$+ka(m+1)×j×p, and the control unit 50 controls the movement amount or movement distance of the base 10 to which the bonding head-side encoder head 31 is attached.

As described above, the mounting apparatus 100 of the embodiment linearly moves the base 10 by the predetermined number of graduations ΔB, sequentially detects the graduation numbers by the bonding head-side encoder head 31 and the camera-side encoder head 32 to create the map of the position compensation coefficient ka(n) of the linear scale 33, and corrects the position of each of the encoder heads 31 and 32 on the basis of the created map of the position compensation coefficient ka(n), and thus the position detection precision of the bonding head 20 and the camera 25 can be improved, and the movement precision of the base 10 can be improved.

Next, another calculation operation of the position compensation coefficient k(n) of the linear scale of the mounting apparatus 100 according to the embodiment is described with reference to FIGS. 7 and 6. The same operations as those described with reference to FIGS. 4 and 5 are denoted by the same step signs and description thereof is omitted.

In the operation shown in FIG. 5, the base 10 is moved by the predetermined number of graduations ΔB, movement graduation numbers of the linear scale 33 are detected by each of the encoder heads 31 and 32, and each position compensation coefficient k(n) is calculated. Thereafter, the number of graduations when the base 10 is moved by a reference distance Lr is detected while the position of the base 10 is detected by the laser distance detector 45, and the position compensation coefficient k(n) is calculated based on the result. The calculation of each position compensation coefficient k(n) is the same as that described above with reference to FIGS. 4 and 5, and description thereof is omitted.

Figure 6:
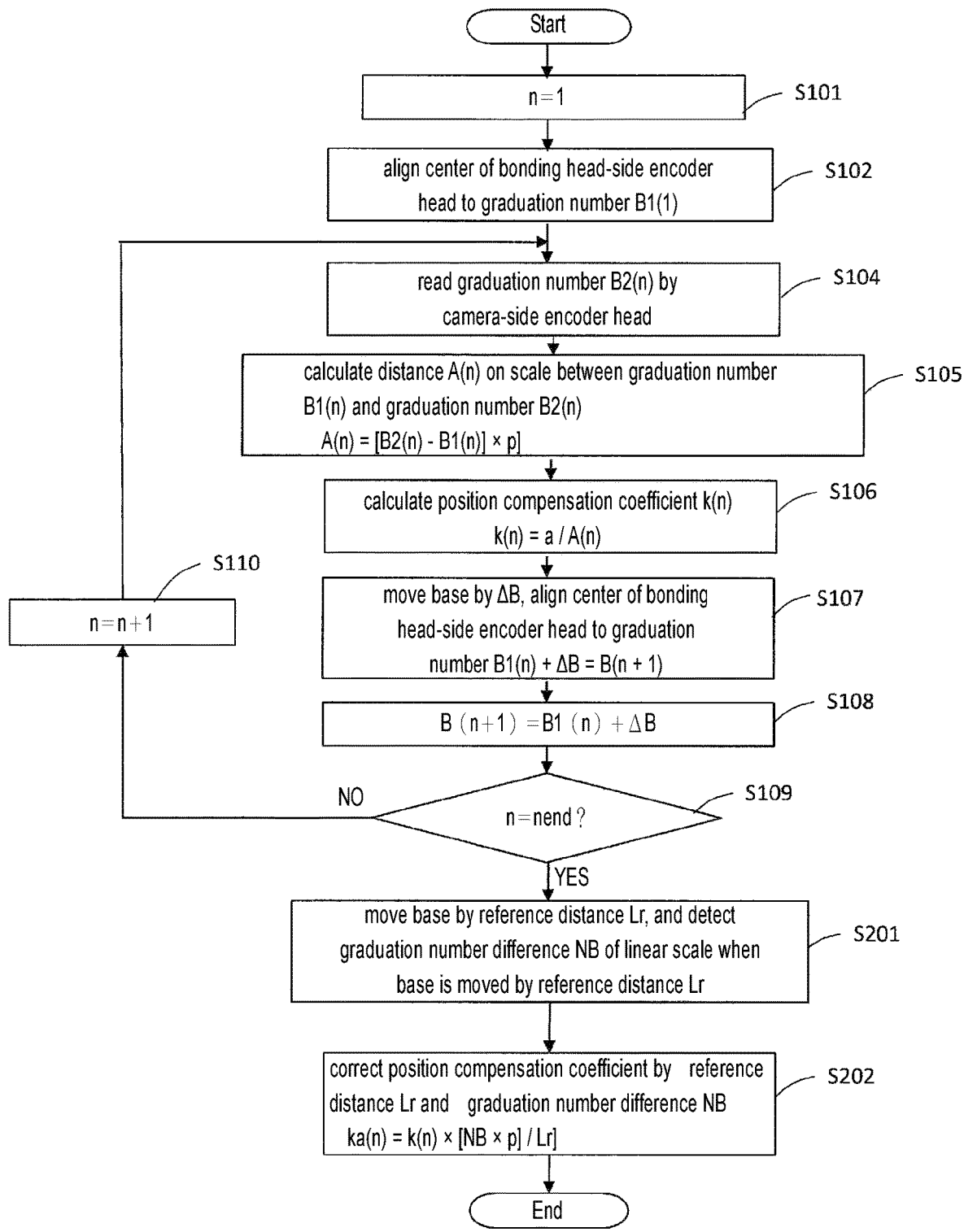
FIG. 6 is a flowchart showing another calculation operation of a position compensation coefficient of the linear scale in the mounting apparatus shown in FIG. 1.

After calculating k(n) by repeatedly executing steps S101 to 3110 in FIG. 6, the control unit 50 proceeds to step S201 in FIG. 6.

Figure 7:
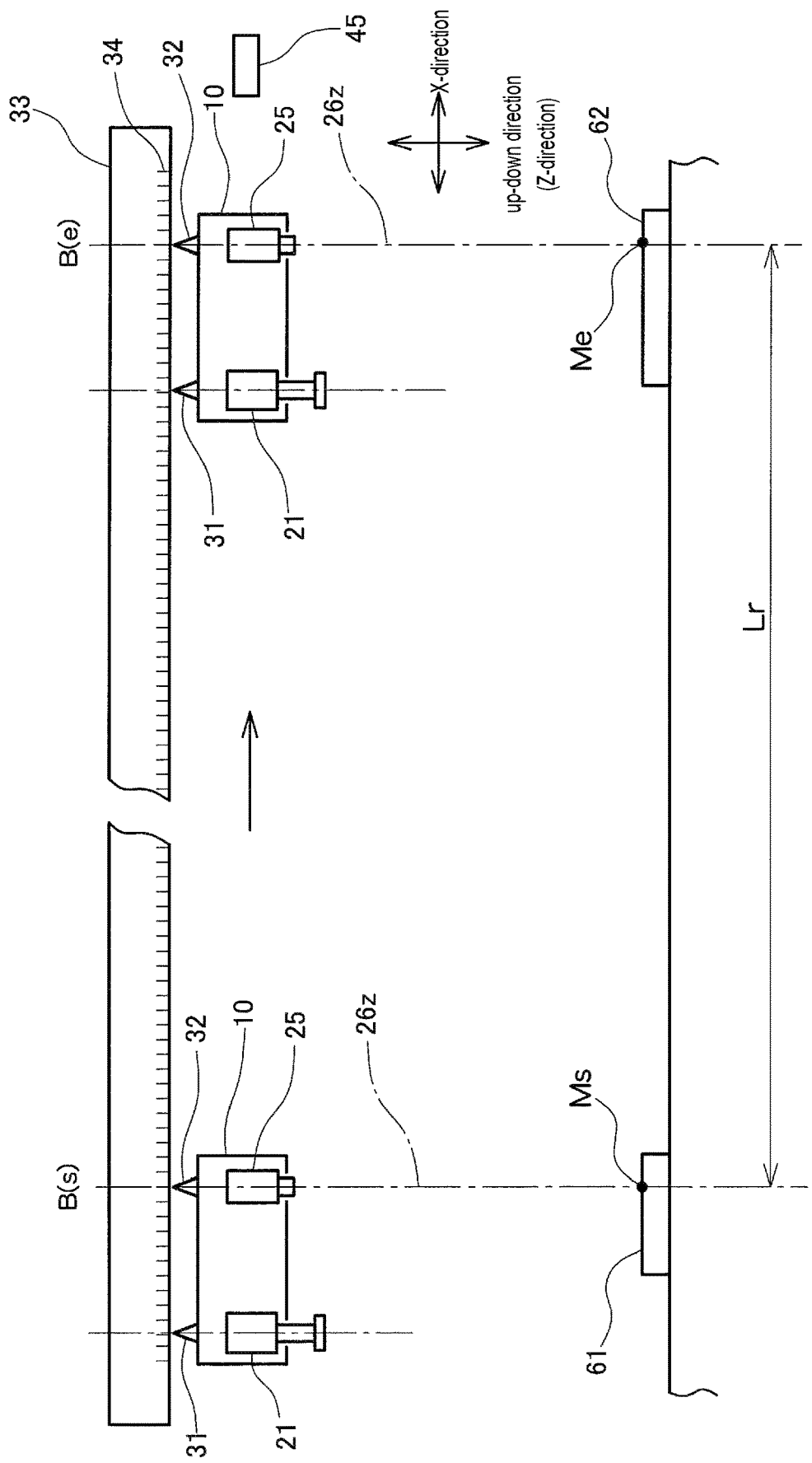
FIG. 7 is an illustration diagram showing a relationship between the linear scale, the base, and a reference member when the base is moved by a reference distance.

In step S201 in FIG. 6, the control unit 50 aligns the base 10 to a predetermined reference position as shown in FIG. 7. Then, the control unit 50 detects, by the camera-side encoder head 32, a graduation number B(s) of the linear scale 33 on which the camera-side encoder head 32 is positioned when the base 10 is at the reference position. In addition, the control unit 50 detects a first distance from the laser distance detector 45 to the base 10 by the laser distance detector 45. Next, the control unit 50 moves the base 10 by the reference distance Lr in the X-direction while detecting the distance to the base 10 by the laser distance detector 45. When the base 10 is moved by the reference distance Lr and reaches a stop position, the control unit 50 detects a graduation number B(e) of the linear scale 33 at the stop position by the camera-side encoder head 32. From a difference=(B(e)−B(s)) between the graduation number of the reference position and the graduation number of the stop position, the control unit 50 calculates a graduation number difference NB=(B(e)−B(s)) of the linear scale 33 when the base 10 is moved by the reference distance Lr.

After detecting the graduation number difference NB, the control unit 50 proceeds to step S202 in FIG. 6 and corrects the position compensation coefficient k(n) by the following (Equation 5).

$$ka(n)=k(n)\times[NB\times p]/Lr] \qquad \text{(Equation 5)}$$

Similarly to the above-described embodiment, the control unit 50 corrects, using the corrected position compensation coefficient ka(n), the position of the center line 31a of the bonding head-side encoder head 31 detected by the linear scale 33 or the position of the center line 32a of the camera-side encoder head 32. In addition, the movement distance of each of the encoder heads 31 and 32 detected by the linear scale 33 is corrected using the corrected position compensation coefficient ka(n), and the movement amount or the movement distance of the base 10 is controlled.

Similarly to the operation described above with reference to FIGS. 4 and 5, the operation can improve the position detection precision of the bonding head 20 and the camera 25 and suppress mounting precision of the electronic components from reducing. Moreover, in the above description, the graduation numbers of the linear scale 33 when the base 10 is at the reference position and the stop position are detected by the camera-side encoder head 32. However, the graduation numbers of the linear scale 33 when the base 10 is at the reference position and the stop position can also be detected by the bonding head-side encoder head 31.

Next, another operation of steps S201 and S202 in FIG. 6 is described.

As shown in FIG. 7, the mounting apparatus 100 of the embodiment has a first reference member 61 in which a position mark Ms is arranged at the reference position and a second reference member 61 in which a position mark Me is arranged at the stop position.

In step S201 of FIG. 6, the control unit 50 aligns the optical axis 26z of the camera 25 to the position of the position mark Ms of the first reference member 61, and detects the graduation number B(s) of the linear scale 33 at the reference position by the camera-side encoder head 32. Next, the control unit 50 moves the base 10 until the optical axis 26z of the camera 25 reaches the position of the position mark Me while acquiring an image with the camera 25. Then, when the optical axis 26z of the camera 25 reaches a stop position of the position mark Me, the graduation number B(e) of the linear scale 33 is detected by the camera-side encoder head 32. Then, from a difference=(B(e)−B(s)) between the graduation number of the reference position and the graduation number of the stop position, the control unit 50 calculates a graduation number difference NB=(B(e)−B(s)) of the linear scale 33 when the base 10 is moved by the reference distance Lr.

Similarly to the above operation, after detecting the graduation number difference NB, the control unit 50 proceeds to step S202 in FIG. 6 and corrects the position compensation coefficient k(n) by the following (Equation 5).

$$ka(n)=k(n)\times[NB\times p]/Lr]. \qquad \text{(Equation 5)}$$

As described above, similarly to the operation described above, the position detection precision of the bonding head 20 and the camera 25 can be improved, and the movement precision of the base 10 can be improved. Moreover, in the above description, the graduation numbers of the linear scale 33 when the base 10 is at the reference position and the stop position are detected by the camera-side encoder head 32. However, the graduation numbers of the linear scale 33 when the base 10 is at the reference position and the stop position can also be detected by the bonding head-side encoder head 31.

The present embodiment has the same effects as the above-described embodiment.

In the embodiment described above, the base 10 is moved by the reference distance Lr by aligning an optical axis 26z of the camera 25 with the position marks Ms and Me, but the position compensation coefficient k(n) can also be corrected using the following method.

The base 10 is moved to a position where the position mark Ms enters the field of view of the camera 25, an image of the position mark Ms is captured, and a distance d1 (not shown) between the optical axis 26z of the camera 25 and the position mark Ms is detected. In addition, the graduation number B(s) of the linear scale 33 is detected by the camera-side encoder head 32. Next, the base 10 is moved to a position where the position mark Me enters the field of view of the camera 25, an image of the position mark Me is detected by the camera 25, and a distance d2 between the optical axis 26z of the camera 25 and the position mark Me is detected. Then, a distance that takes the distances d1 and d2 (not shown) into consideration for the reference distance Lr is acquired as an approximate reference distance Lr1. In addition, the graduation number B(e) of the linear scale 33 is detected by the camera-side encoder head 32.

Then, from the graduation number difference NB=(B(e)−B(s)) and the approximate reference distance Lr1, the position compensation coefficient k(n) is corrected by the following (Equation 6).

$$ka(n)=k(n)\times[NB\times p]/Lr1] \qquad \text{(Equation 6)}$$

Moreover, the graduation numbers B(s) and B(e) of the linear scale 33 can be detected by the bonding head-side encoder head 31 in place of the camera-side encoder head 32.

As described above, the mounting apparatus 100 of the embodiment can improve the position detection precision of the bonding head 20 and the camera 25 and can improve the movement precision of the base 10 as in the above-described embodiment.

In the above description, the embodiments of the present invention are described using the mounting apparatus 100 as an example, but the present invention is not limited to flip-chip bonding apparatuses or die bonding apparatuses and can be applied to various apparatuses. For example, the present invention can be applied to wire bonding apparatuses, industrial robots, and transport apparatuses. The present invention can be applied to any apparatus without limitation on the object to be transported or mounted, the size of the object, and the technical field of the object.

What is claimed is:

1. An apparatus which linearly moves a movable body with respect to an object, the apparatus comprising:
the movable body which is moved linearly with respect to the object and has a first position and a second position apart from each other by a predetermined interval in a movement direction;
a scale which is arranged along the movement direction of the movable body and in which a plurality of graduations is arranged with predetermined pitches along the movement direction;
a first detection unit which is arranged in the first position of the movable body and detects a first graduation number of the scale with respect to the first position;
a second detection unit which is arranged in the second position of the movable body and detects a second graduation number of the scale with respect to the second position; and
a control unit which sequentially detects the first graduation number and the second graduation number by the first detection unit and the second detection unit while moving the movable body along the scale, and controls a movement amount of the movable body on a basis of a ratio of the predetermined interval with respect to a distance between the first graduation number and the second graduation number on the scale.

2. The apparatus according to claim 1, wherein
the movable body is a transport mechanism which transports a semiconductor die to the object,
the object is a substrate on which the semiconductor die that has been transported is mounted or other semiconductor die, and
the apparatus is for mounting the semiconductor die on the object.

3. The apparatus according to claim 1, wherein
the control unit calculates, on a basis of the ratio of the predetermined interval with respect to the distance between the first graduation number and the second graduation number on the scale, a position compensation coefficient for each predetermined number of graduations from one end of the scale.

4. The apparatus according to claim 1, further comprising
a distance detector for detecting a distance of the movable body from a reference position, wherein
the control unit moves the movable body by a reference distance while detecting the distance of the movable body from the reference position by the distance detector, and detects a graduation number difference of the scale before and after moving the movable body by the reference distance by the first detection unit or the second detection unit, and
corrects the movement amount on a basis of the reference distance and the graduation number difference.

5. The apparatus according to claim 1, further comprising:
a reference member in which position marks are arranged apart from each other by a reference distance; and
an image acquisition part which is arranged in the movable body and acquires images of the position marks, wherein
the control unit moves the movable body by the reference distance on a basis of the images of the position marks acquired by the image acquisition part, detects the graduation number difference of the scale at a time of moving by the first detection unit or the second detection unit, and
corrects the movement amount on a basis of the reference distance and the graduation number difference.

6. A method for linearly moving a movable body with respect to an object, the method comprising:
linearly moving the movable body having a first position and a second position apart from each other by a predetermined interval in a movement direction with respect to the object;
arranging a scale along the movement direction of the movable body, wherein a plurality of graduations is arranged with predetermined pitches along the movement direction in the scale;
arranging a first detection unit for detecting a first graduation number of the scale with respect to the first position in the first position of the movable body;
arranging a second detection unit for detecting a second graduation number of the scale with respect to the second position in the second position of the movable body; and
sequentially detecting the first graduation number and the second graduation number by the first detection unit and the second detection unit while moving the movable body along the scale, and controlling a movement amount of the movable body on a basis of a ratio of the predetermined interval with respect to a distance between the first graduation number and the second graduation number on the scale.

7. The method according to claim 6, further comprising:
detecting a distance of the movable body from a reference position by a distance detector;
moving the movable body by a reference distance while detecting the distance of the movable body from the reference position by the distance detector, and detecting a graduation number difference of the scale before and after moving the movable body by the reference distance by the first detection unit or the second detection unit; and
correcting the movement amount on a basis of the reference distance and the graduation number difference.

8. The method according to claim 6, further comprising:
arranging position marks apart from each other by a reference distance in a reference member;
arranging an image acquisition part in the movable body;
acquiring images of the position marks by the image acquisition part, and moving the movable body by the reference distance on a basis of the acquired images of the position marks;
detecting the graduation number difference of the scale when the movable body is moved by the reference distance by the first detection unit or the second detection unit; and
correcting the movement amount on a basis of the reference distance and the graduation number difference.

9. The apparatus according to claim 2, wherein
the control unit calculates, on a basis of the ratio of the predetermined interval with respect to the distance between the first graduation number and the second graduation number on the scale, a position compensation coefficient for each predetermined number of graduations from one end of the scale.

10. The apparatus according to claim 2, further comprising
a distance detector for detecting a distance of the movable body from a reference position, wherein
the control unit moves the movable body by a reference distance while detecting the distance of the movable body from the reference position by the distance detector, and detects a graduation number difference of the scale before and after moving the movable body by the reference distance by the first detection unit or the second detection unit, and corrects the movement amount on a basis of the reference distance and the graduation number difference.

* * * * *